United States Patent
Park et al.

(10) Patent No.: US 10,812,040 B2
(45) Date of Patent: Oct. 20, 2020

(54) ACOUSTIC WAVE FILTER DEVICE

(71) Applicant: Samsung Electro-Mechanics Co., Ltd., Suwon-si (KR)

(72) Inventors: Yoon Sok Park, Suwon-si (KR); Won Kyu Jeung, Suwon-si (KR); Tah Joon Park, Suwon-si (KR); Dae Hun Jeong, Suwon-si (KR); Sang Uk Son, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/356,223

(22) Filed: Mar. 18, 2019

(65) Prior Publication Data

US 2020/0036358 A1 Jan. 30, 2020

(30) Foreign Application Priority Data

Jul. 24, 2018 (KR) .................... 10-2018-0085963

(51) Int. Cl.
*H03H 9/05* (2006.01)
*H03H 9/56* (2006.01)
(Continued)

(52) U.S. Cl.
CPC ............ *H03H 9/0514* (2013.01); *H03H 9/13* (2013.01); *H03H 9/174* (2013.01); *H03H 9/176* (2013.01); *H03H 9/562* (2013.01); *H03H 9/564* (2013.01)

(58) Field of Classification Search
CPC ........ H03H 9/0514; H03H 9/13; H03H 9/174; H03H 9/176; H03H 9/562; H03H 9/564
(Continued)

(56) References Cited

U.S. PATENT DOCUMENTS 6,812,619 B1 11/2004 Kaitila et al.
9,461,616 B2 10/2016 Umeda
(Continued)

FOREIGN PATENT DOCUMENTS

JP 2018-093388 A 6/2018
KR 10-0799391 B1 1/2008
(Continued)

OTHER PUBLICATIONS

Merriam-Webster Dictionary, the meaning of the word, "Dispose" and "surround", copyright 2020 (Year: 2020).*
(Continued)

*Primary Examiner* — Benny T Lee
*Assistant Examiner* — Hafizur Rahman
(74) *Attorney, Agent, or Firm* — NSIP Law

(57) ABSTRACT

An acoustic wave filter device includes resonance portions, first and second metal pads. The resonance portions each includes a lower electrode disposed on a substrate, a piezoelectric layer disposed on at least a portion of the lower electrode, and an upper electrode disposed on at least a portion of the piezoelectric layer. The first metal pads are connected to one of the upper electrode and the lower electrode of a corresponding resonance portion among the resonance portions. The second metal pads are disposed outwardly of an active region and connected to the other one of the upper electrode and the lower electrode of adjacent resonant portions among the resonance portions. A ring portion is disposed outwardly of the active region in which the lower electrode, the piezoelectric layer, and the upper electrode overlap is disposed only on a portion of any one of the first and second metal pads.

18 Claims, 5 Drawing Sheets

(51) Int. Cl.
*H03H 9/17* (2006.01)
*H03H 9/13* (2006.01)

(58) Field of Classification Search
USPC .......................................................... 333/191
See application file for complete search history.

(56) References Cited

U.S. PATENT DOCUMENTS

| | | |
|---|---|---|
| 2002/0190814 A1 | 12/2002 | Yamada et al. |
| 2016/0294358 A1* | 10/2016 | Ono ........................ H03H 9/564 |
| 2016/0301380 A1* | 10/2016 | Lee ..................... H03H 9/02133 |
| 2018/0013401 A1 | 1/2018 | Lee et al. |
| 2018/0123554 A1 | 5/2018 | Kyoung et al. |
| 2018/0159508 A1 | 6/2018 | Irieda et al. |

FOREIGN PATENT DOCUMENTS

| | | |
|---|---|---|
| KR | 10-2018-0006248 A | 1/2018 |
| KR | 10-2018-0046843 A | 5/2018 |

OTHER PUBLICATIONS

Korean Office Action dated Jun. 24, 2019 in corresponding Korean Application No. 10-2018-0085963 (6 pages in English, 6 pages in Korean).

\* cited by examiner

ACOUSTIC WAVE FILTER DEVICE

CROSS-REFERENCE TO RELATED APPLICATION

This application claims benefit under 35 USC 119(a) of Korean Patent Application No. 10-2018-0085963 filed on Jul. 24, 2018 in the Korean Intellectual Property Office, the entire disclosure of which is incorporated herein by reference for all purposes.

BACKGROUND

1. Field

The present disclosure relates to an acoustic wave filter device.

2. Description of Related Art

Due to the market trend for mobile communications devices demand that has led to available frequencies being saturated and explosive growth in the number of smartphone data users, additional frequencies are being secured through carrier aggregation, the use of high frequency bands, and the like. Therefore, filters continue to be important in separating signals between different frequency bands. In addition, filters themselves have become smaller and thinner in order to filter various frequency bands.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic wave filter device includes resonance portions, first metal pads, and second metal pads. The resonance portions each includes a lower electrode disposed on a substrate, a piezoelectric layer disposed on at least a portion of the lower electrode, and an upper electrode disposed on at least a portion of the piezoelectric layer. The first metal pads are connected to one of the upper electrode and the lower electrode of a corresponding resonance portion among the resonance portions. The second metal pads are disposed outwardly of an active region and connected to the other one of the upper electrode and the lower electrode of adjacent resonant portions among the resonance portions. A ring portion is disposed outwardly of the active region in which the lower electrode, the piezoelectric layer, and the upper electrode overlap is disposed only on a portion of any one of the first and second metal pads.

The ring portion may be disposed to surround a portion of the active region.

The first metal pads may be connected to the lower electrode, the second metal pads are connected to the upper electrode, the ring portion may only be provided in a portion of the first metal pads.

The second metal pads may connect the upper electrode of the adjacent resonance portions.

An interval between adjacent resonance portions connected to the first metal pad having the ring portion may be greater than an interval between adjacent resonance portions connected to the first metal pad not having the ring portion.

The second metal pad disposed opposite to the first metal pad not having the ring portion may include a magnitude in which a conceptual strip shape extending from the ring portion is removed from the second metal pad disposed opposite to the first metal pad having the ring portion.

The first and second metal pads may be formed of any one of gold (Au), a gold-tin (Au—Sn) alloy, copper (Cu), a copper-tin (Cu—Sn) alloy, aluminum (Al), and an aluminum alloy.

The resonance portion may further include a cavity formed between a membrane layer and the substrate.

The resonance portion may further include a passivation layer disposed in a region outside a region in which the first and second metal pads are formed.

The resonance portion may further include an etching prevention portion disposed between the substrate and the lower electrode and disposed around the cavity.

The resonance portion may further include an insertion layer disposed in a position lower than a position of a portion of the piezoelectric layer.

The upper electrode may include a frame portion disposed at an edge of the active region, and the ring portion is disposed outside of the frame portion.

In another general aspect, an acoustic wave filter device includes resonance portions, first metal pads, and second metal pads. The resonance portions each includes a lower electrode disposed on a substrate, a piezoelectric layer disposed on at least a portion of the lower electrode, and an upper electrode disposed on at least a portion of the piezoelectric layer. For each of the resonant portions, one of the upper electrode and the lower electrode is connected to a corresponding one of the first metal pads. For each of the resonant portions, the other of the upper electrode and the lower electrode is connected to a corresponding one of the second metal pads. A ring portion is disposed outwardly of an active region in which the lower electrode, the piezoelectric layer, and the upper electrode overlap is disposed only on a portion of any one of the first and second metal pads.

The ring portion may be disposed to surround a portion of the active region.

The first metal pads may be connected to the lower electrode, the second metal pads are connected to the upper electrode, the ring portion may be only provided in a portion of the first metal pads.

The second metal pads may connect the upper electrode of the adjacent resonance portions.

The first and second metal pads may be formed of any one of gold (Au), a gold-tin (Au—Sn) alloy, copper (Cu), a copper-tin (Cu—Sn) alloy, aluminum (Al), and an aluminum alloy.

The resonance portion may further include a cavity formed between a membrane layer and the substrate.

The resonance portion may further include a passivation layer disposed in a region outside a region in which the first and second metal pads are formed.

Other features and aspects will be apparent from the following detailed description, the drawings, and the claims.

DETAILED DESCRIPTION

Figure 1:
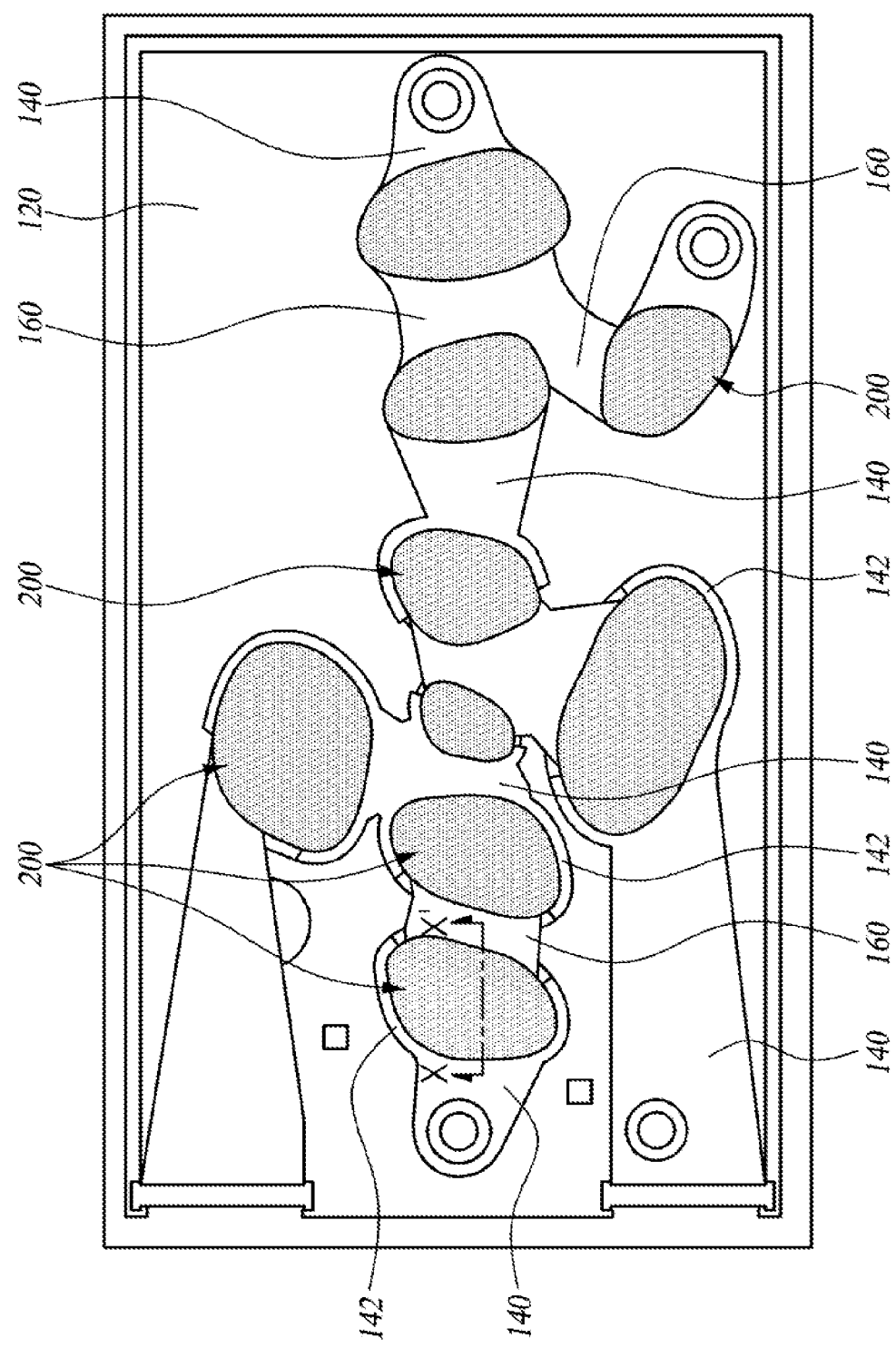
FIG. 1 is a plan view illustrating an example of a portion of an acoustic wave filter device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
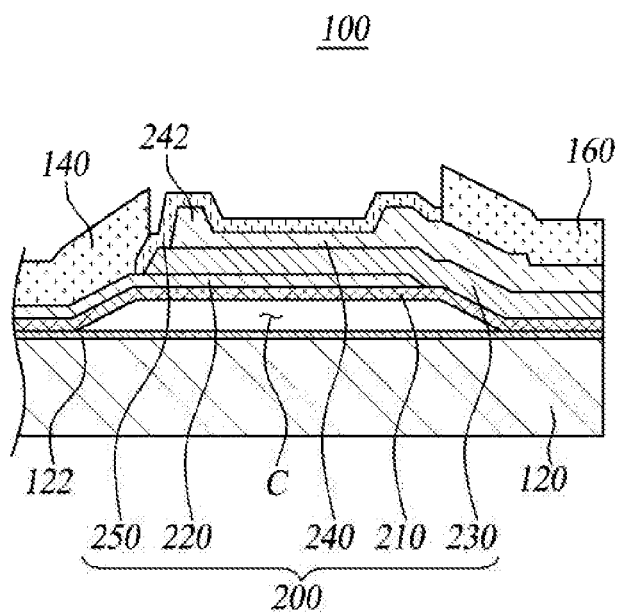
FIG. 2 is a cross-sectional view taken along line X-X' in FIG. 1.

FIG. 1 is a plan view illustrating an example of a portion of an acoustic wave filter device and FIG. 2 is a cross-sectional view taken along line X-X' in FIG. 1.

Referring to FIGS. 1 and 2, an acoustic wave filter device 100 of the present application may include a substrate 120, a resonance portion 200, a ring or peripheral portion 242, a first metal pad 140, and a second metal pad 160.

The substrate 120 may be a silicon substrate. For example, as the substrate 120, a silicon wafer and/or a silicon on insulator (SOI) type substrate may be used.

An insulation layer 122 may be formed on an upper surface of the substrate 120, and may electrically isolate the substrate 120 from circuitries formed in a position higher than a position of the substrate. The insulation layer 122 may also function to prevent the substrate 120 from being etched by an etching gas when a cavity C is formed during the manufacturing process.

In this example, the insulation layer 122 may be formed of any one or any combination of any two or more of silicon dioxide ($SiO_2$), silicon nitride ($Si_3N_4$), aluminum oxide ($Al_2O_3$), and aluminum nitride (AlN) by at least one of a chemical vapor deposition process, a RF magnetron sputtering process, and an evaporation process.

The resonance portion 200 may be formed on the substrate 120. For example, the resonance portion 200 may include a membrane layer 210, a lower electrode 220, a piezoelectric layer 230, an upper electrode 240, and a passivation layer 250.

The cavity C may be formed between the membrane layer 210 and the substrate 120. In addition, the membrane layer 140 may be formed of a material that has low reactivity with the etching gas, when the sacrificial layer (not illustrated) is removed. A dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as the membrane layer 210.

A seed layer (not illustrated) formed of aluminum nitride (AlN) may be formed on the membrane layer 210. For example, the seed layer may be disposed between the membrane layer 210 and the first electrode 220. The seed layer may be formed using a dielectric or a metal having an HCP crystal structure in addition to aluminum nitride (AlN). In an example, when the seed layer is a metal, the seed layer may be formed of titanium (Ti).

The lower electrode 220 may be formed on the membrane layer 210, and a portion thereof may be disposed on an upper portion of the cavity C. In addition, the lower electrode 220 may be used as either an input electrode or an output electrode for inputting and outputting an electrical signal such as a radio frequency (RF) signal, and the like.

The lower electrode 220 may be formed using a conductive material such as molybdenum (Mo), or alloys thereof; however, the present disclosure is not limited thereto and the lower electrode 220 may be formed of a conductive material such as ruthenium (Ru), tungsten (W), iridium (Ir), platinum (Pt), copper (Cu), titanium (Ti), tantalum (Ta), nickel (Ni), chromium (Cr), and the like, or alloys thereof.

The piezoelectric layer 230 may be formed to cover at least a portion of the lower electrode 220 disposed in a position above the cavity C. The piezoelectric layer 230 may piezoelectrically to convert electrical energy into mechanical energy in the form of an acoustic wave, and may be formed of any one or any combination of any two or more of aluminum nitride (AlN), zinc oxide (ZnO), and lead zirconium titanium oxide (PZT; PbZrTiO). In particular, when the piezoelectric layer 230 is formed of aluminum nitride (AlN), the piezoelectric layer 230 may further include a rare earth metal. In an example, the rare earth metal may include at least one of scandium (Sc), erbium (Er), yttrium (Y), and lanthanum (La). In addition, as an embodiment, the transition metal may include at least one of titanium (Ti), zirconium (Zr), hafnium (Hf), tantalum (Ta), and niobium (Nb). Magnesium (Mg), which is a divalent metal, may also be included.

The upper electrode 240 may be formed to cover at least a portion of the piezoelectric layer 230 disposed above the cavity C. The upper electrode 240 may either be used as an input electrode or an output electrode for inputting and outputting an electrical signal such as a radio frequency (RF) signal, and the like. For example, when the lower electrode 220 is used as an input electrode, the upper electrode 240 may be used as an output electrode, and vice-versa.

The upper electrode 240 may be formed using a conductive material such as molybdenum (Mo), or alloys thereof; however, the present disclosure is not limited thereto, and the upper electrode 240 may be formed of a conductive material such as ruthenium (Ru), tungsten (W), iridium (Ir), platinum (Pt), copper (Cu), titanium (Ti), tantalum (Ta), nickel (Ni), chromium (Cr), and the like, or alloys thereof.

The passivation layer 250 may be formed in a region above the lower electrode 220 and the upper electrode 240 except for a portion of the lower electrode 220 and the upper electrode 240. The passivation layer 250 may prevent damage to the upper electrode 240 and the lower electrode 220 during the manufacturing process.

Further, the passivation layer 250 may be partially removed in a final process by etching depending on the desired frequency control. For example, the thickness of the passivation layer 250 may be adjusted. A dielectric layer containing any one or any combination of any two or more of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as the passivation layer 250.

The active area of the acoustic wave filter device 100 refers to a region in which the lower electrode 220, the piezoelectric layer 230, and the upper electrode 240 overlap.

A first metal pad 140 may be provided in plural form. The first metal pad 140 may be disposed outwardly of an active region and may be connected to the lower electrode 220. For example, the first metal pad 140 may be connected to the lower electrode 220 provided in a neighboring resonance portion 200. However, only a portion of the plurality of first metal pads 140 may include a ring or peripheral portion 142 disposed to surround the active area. In other words, a portion or select ones of the plurality of first metal pads 140 may each have a ring portion 142 disposed to surround the active area without interfering with the second metal pad 160. The remaining portions of the plurality of first metal pads 140 not selected may not have the ring portion 142.

The first metal pad 140 not including the ring portion 142 may be formed to be relatively small, as a size of a conceptual band connecting the ring portion 142. For example, in an example where the first metal pad 140 does not include the ring portion 142, a conceptual strip shape connecting the ring portion 142 extending from both sides of the first metal pad 140, as well as the ring portion 142 extending from both sides of the first metal pad 140 may be removed from the first metal pad 140. A detailed description thereof will be further described later.

For example, the first metal pad 140 may be formed of a material such as gold (Au), a gold-tin (Au—Sn) alloy, copper (Cu), a copper-tin (Cu—Sn) alloy, aluminum (Al), an aluminum alloy, and the like. For example, the aluminum alloy may be an aluminum-germanium (Al—Ge) alloy.

A second metal pad 160 may be provided in plural form as a plurality of second metal pads 160. The second metal pad 160 may be disposed outwardly of an active region and may be connected to the upper electrode 240. For example, the second metal pad 160 may be connected to the upper electrode 240 provided in a neighboring resonance portion 200. However, all of the plurality of second metal pads 160 do not have a configuration that corresponds to the ring portion 142 of the first metal pad 160. In the plurality of second metal pads 160, a length of the second metal pad 160 disposed opposite to the first metal pad 140 having the ring portion 142 may be longer than a length of the second metal pad 160 disposed opposite the first metal pad 140 not having the ring portion 142. A detailed description thereof will be further described later.

For example, the second metal pad 160 may be formed of a material such as gold (Au), a gold-tin (Au—Sn) alloy, copper (Cu), a copper-tin (Cu—Sn) alloy, aluminum (Al), an aluminum alloy, and the like. For example, the aluminum alloy may be an aluminum-germanium (Al—Ge) alloy.

Since the second metal pad 160 does not have a configuration corresponding to the ring portion 142, the size of the second metal pad 160 may be reduced. Therefore, the resistance may be reduced and the electrical performance may consequently increase.

Hereinafter, the performance difference between the resonance portion connected to the first metal pad having the ring portion and the resonance portion connected to the first metal pad not having the ring portion will be described with reference to the drawings.

Figure 3:
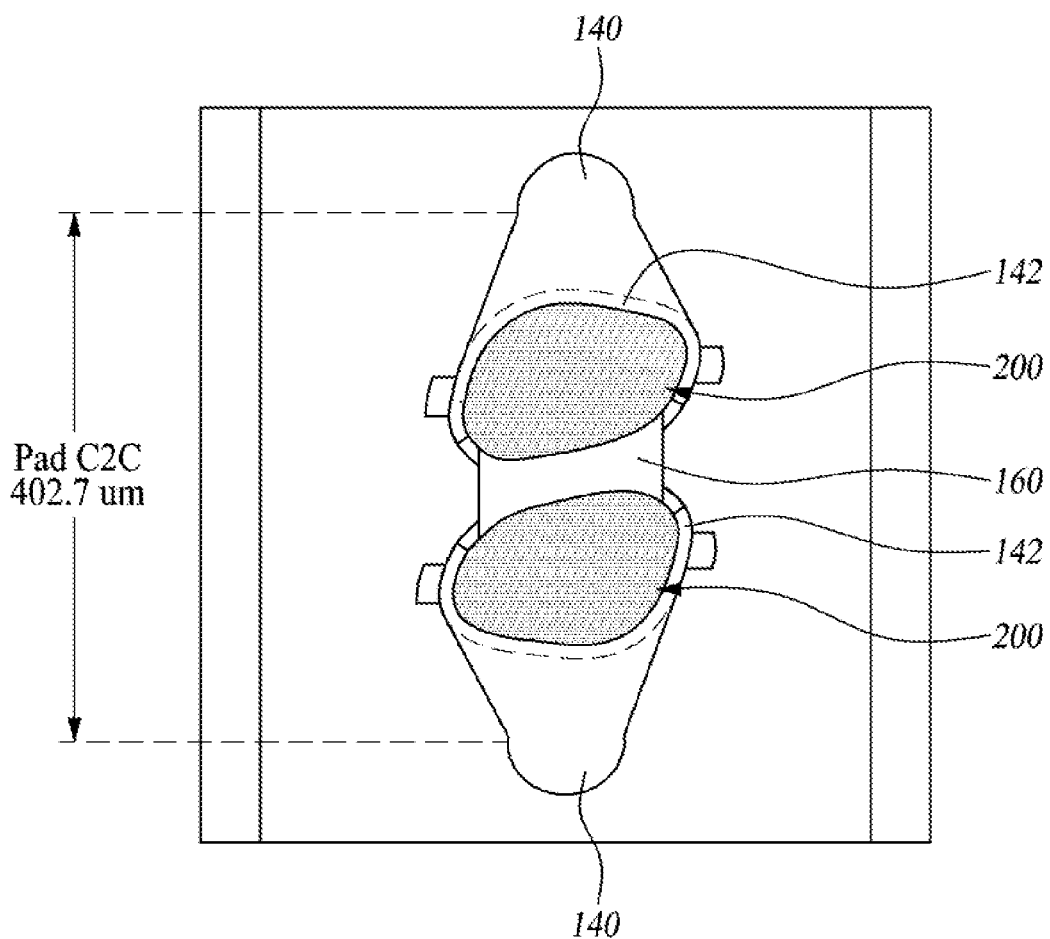
FIG. 3 is a plan view illustrating an example of a resonance portion connected to a first metal pad having a ring portion.
Figure 4:
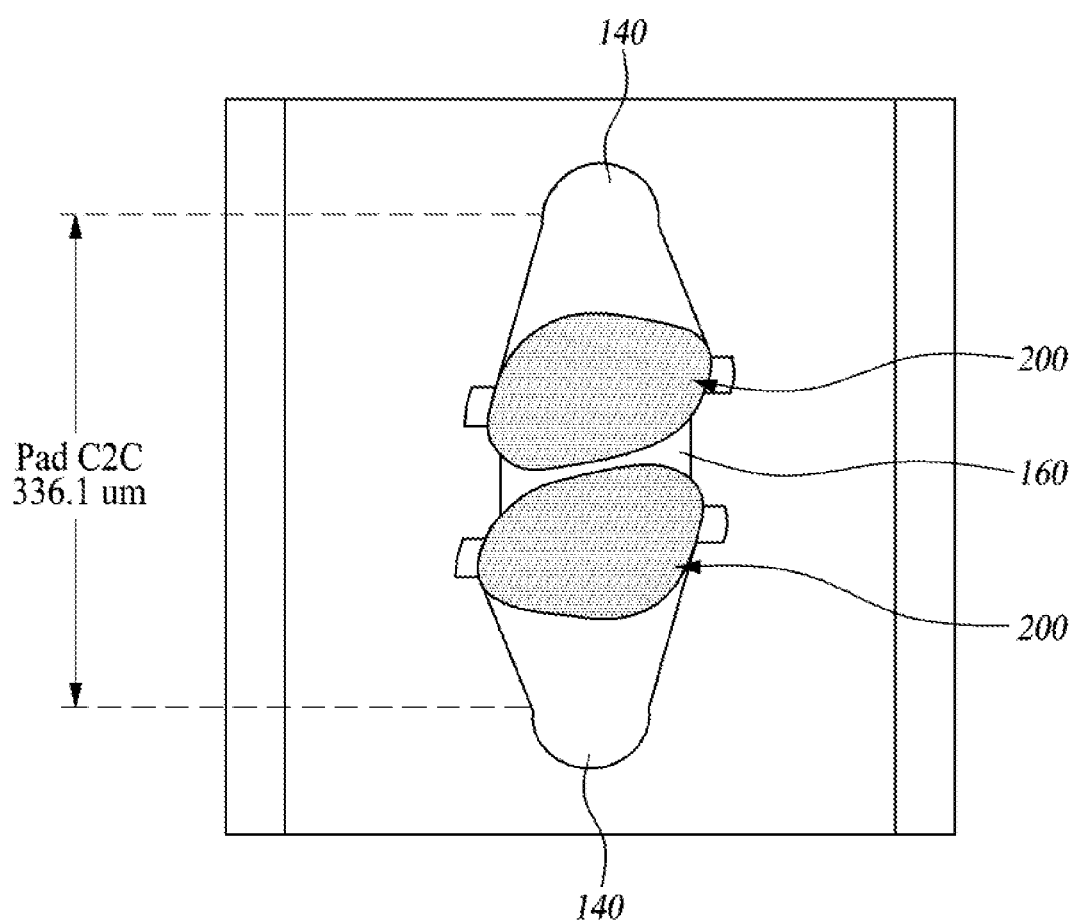
FIG. 4 is a plan view illustrating an example of a resonance portion connected to a first metal pad without a ring portion.

FIG. 3 is a plan view illustrating an example of a resonance portion connected to a first metal pad having a ring portion, and FIG. 4 is a plan view illustrating an example of a resonance portion connected to a first metal pad not having a ring portion.

Referring to FIG. 3, a first metal pad 140 may include a ring portion 142, and a second metal pad 160 may not include a configuration corresponding to a ring portion 142. As an example, the distance between reference positions (centers of circular pads C2C disposed in upper and lower portions) may be 402.7 μm.

Referring to FIG. 4, a first metal pad 140 and a second metal pad 160 does not include a ring portion 142. As an example, the distance between reference positions (centers of circular pads C2C disposed in upper and lower portions) may be 336.1 μm.

Referring to the above in further detail, the first metal pad 140 not including the ring portion 142, as illustrated in FIG. 4, may be formed relatively small as compared to the size of a first metal pad 140 that includes a ring portion 142. For example, a conceptual strip shape connecting the ring portion 142 extending from both sides of the first metal pad 140 as well as the ring portion 142 extending from both sides of the first metal pad 140, as illustrated in FIG. 3, may be removed from the first metal pad 140 in the example of the first metal pad 140 without the ring portion 142, as illustrated in FIG. 3. Therefore, the first metal pad 140 without the ring portion 142, as illustrated in FIG. 4, may be formed to be relatively smaller than a size of the first metal pad 140 that includes the ring portion 142, as illustrated in FIG. 3.

The size of the second metal pad 160 disposed opposite to the first metal pad 140 that includes the ring portion 142, as illustrated in FIG. 3, may be formed to be larger than the size of the second metal pad 160 disposed opposite to the first metal pad 140 without the ring portion 142, as illustrated in FIG. 4.

For example, a conceptual strip shape extending from the ring portion 142 in the second metal pad 160 disposed opposite to the first metal pad 140 having the ring portion 142, as illustrated in FIG. 3, may be removed from the second metal pad 160 disposed opposite to the first metal pad 140 having the ring portion 142, to form the second metal pad 160 illustrated in FIG. 4.

Figure 5:
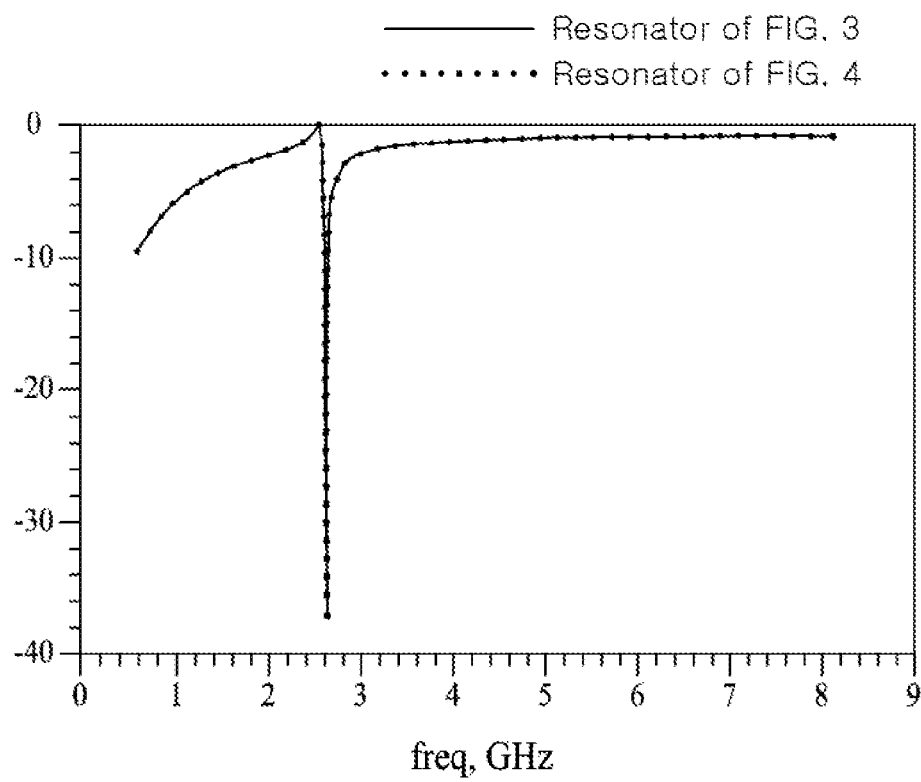
FIG. 5 is a graph illustrating a waveform of a resonance portion illustrated in FIG. 3 and a waveform of a resonance portion illustrated in FIG. 4.

As illustrated in FIG. 5, a waveform of the resonance portion illustrated in FIG. 3 is similar to a waveform of the resonance portion illustrated in FIG. 4.

Figure 6:
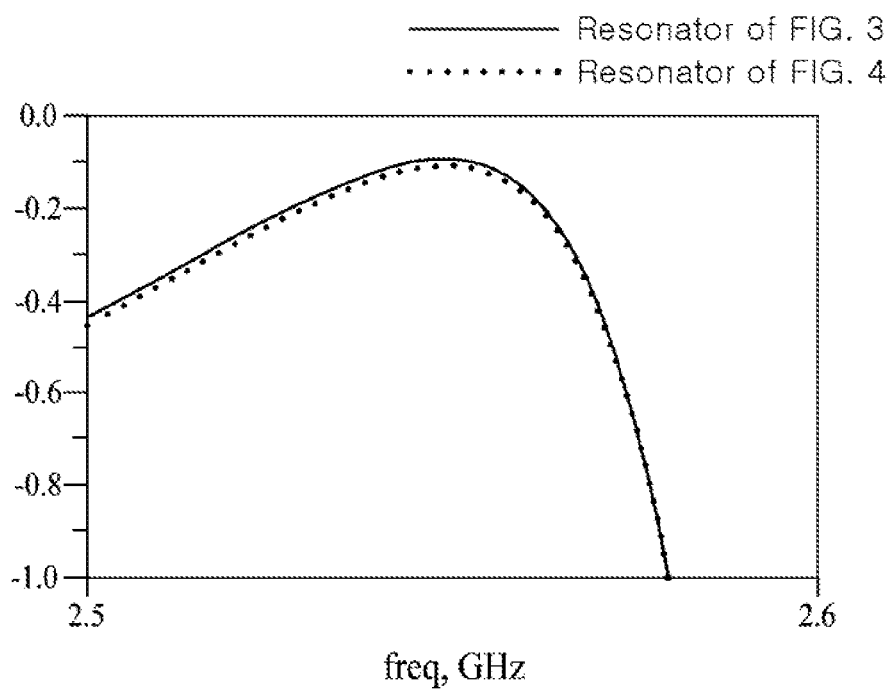
FIG. 6 is a graph illustrating the performance at a resonance point by a resonance portion illustrated in FIG. 3 and the performance at a resonance point by a resonance portion illustrated in FIG. 4.

As illustrated in FIG. 6, the performance at a resonance point by the resonance portion illustrated in FIG. 3 is similar to the performance at a resonance point by the resonance portion illustrated in FIG. 4. For example, the fluctuation in resonance frequency may insignificantly occur within 0.15 MHz, and the loss at the resonance point may be slightly degraded from −0.094 dB to −0.107 dB.

Figure 7:
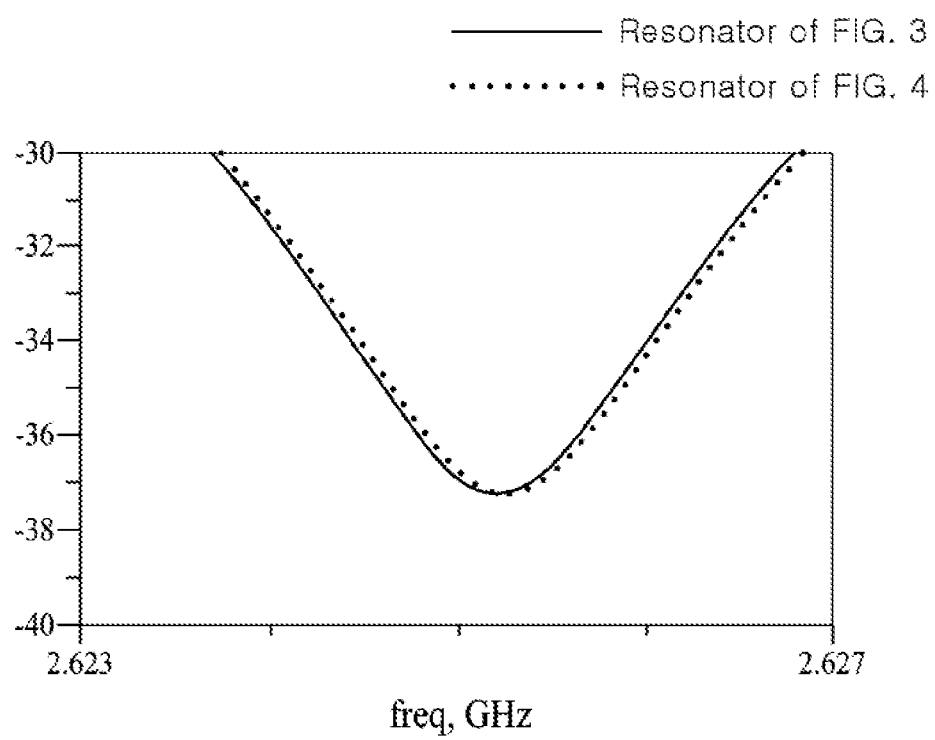
FIG. 7 is a graph illustrating the performance at an anti-resonance point by a resonance portion illustrated in FIG. 3 and performance at an anti-resonance point by a resonance portion illustrated in FIG. 4.

Furthermore, as illustrated in FIG. 7, the performance at an anti-resonance point by a resonance portion illustrated in FIG. 3 is not substantially different from the performance at an anti-resonance point by a resonance portion illustrated in FIG. 4. For example, it can be seen that fluctuation in anti-resonance frequency may insignificantly occur within 0.05 MHz, and loss at the anti-resonance point may be slightly degraded from −37.228 dB to −37.235 dB.

However, as illustrated in FIG. 4, it can be seen that an area reduction of about 16% on a layout may be realized.

Hereinafter, a modified embodiment of a resonance portion will be described with reference to the drawings. First and second metal pads are denoted by the same reference numerals, and a detailed description thereof will be omitted.

Figure 8:
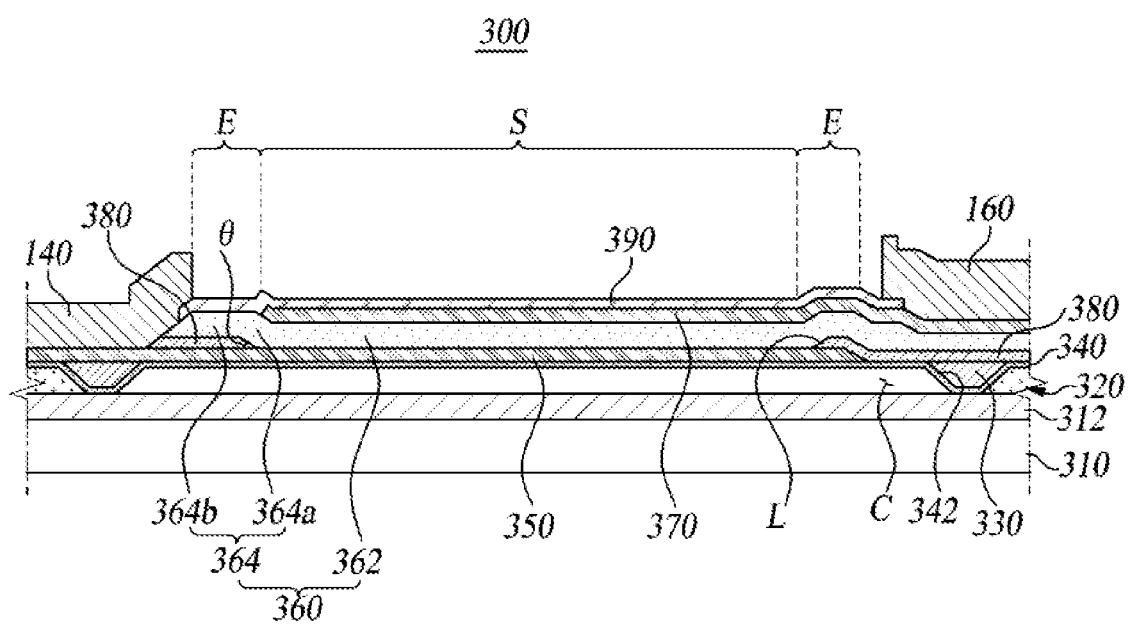
FIG. 8 is a schematic cross-sectional view illustrating an example of a resonance portion.

FIG. 8 is a schematic cross-sectional view illustrating an example of a resonance portion.

Referring to FIG. 8, a resonance portion 300 may include a sacrificial layer 320, an etching prevention portion 330, a membrane layer 340, a lower electrode 350, a piezoelectric layer 360, an upper electrode 370, an insertion layer 380, and a passivation layer 390, in one example.

The sacrificial layer 320 may be formed on an insulation layer 122 of a substrate 120, and a cavity C and the etching prevention portion 330 may be arranged in an inward direction of the sacrificial layer 320. The cavity C may be formed by removing a portion of sacrificial layer 320 during the manufacturing process. As described above, as the cavity C is formed in an inward direction of the sacrifice layer 320, the lower electrode 350, and the like, disposed in a position above the sacrificial layer 320 may be formed flat shaped.

The etching prevention portion 330 may be disposed along a boundary of the cavity C. The etching prevention portion 330 may prevent etching from proceeding beyond a region of the cavity in a process of forming the cavity C.

The cavity C may be formed between the membrane layer 340 and the substrate 120. In addition, the membrane layer 340 may be formed of a material having low reactivity with the etching gas, when the sacrificial layer 320 is removed. The etching prevention portion 330 may be inserted into a groove 342 formed by the membrane layer 340. A dielectric layer containing any one or any combination of any two or more of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as the membrane layer 340.

A seed layer (not illustrated) formed of aluminum nitride (AlN) may be formed on the membrane layer 340. For example, the seed layer may be disposed between the membrane layer 340 and the lower electrode 350. The seed layer may be formed using a dielectric or a metal having an HCP crystal structure in addition to aluminum nitride (AlN). As an embodiment, when the seed layer is a metal, the seed layer may be formed of titanium (Ti).

The lower electrode 350 may be formed on the membrane layer 340, and a portion thereof may be disposed on an upper portion of the cavity C. In addition, the lower electrode 350 may be used as either an input electrode or an output electrode for inputting and outputting an electrical signal such as a radio frequency (RF) signal, and the like.

The lower electrode 350 may be formed using a conductive material such as molybdenum (Mo), or alloys thereof; however, the present disclosure is not limited thereto, and the lower electrode 350 may be formed of a conductive material such as ruthenium (Ru), tungsten (W), iridium (Ir), platinum (Pt), copper (Cu), titanium (Ti), tantalum (Ta), nickel (Ni), chromium (Cr), and the like, or alloys thereof.

The piezoelectric layer 360 may be formed to cover at least a portion of the lower electrode 350 disposed in a position above the cavity C. The piezoelectric layer 360 may be a portion causing a piezoelectric effect to convert electrical energy into mechanical energy in the form of an acoustic wave, and may be formed of any one of aluminum nitride (AlN), zinc oxide (ZnO), and lead zirconium titanium oxide (PZT; PbZrTiO). In particular, when the piezoelectric layer 360 is formed of aluminum nitride (AlN), the piezoelectric layer 360 may further include a rare earth metal. As an example, the rare earth metal may include at least one of scandium (Sc), erbium (Er), yttrium (Y), and lanthanum (La). In addition, as an embodiment, the transition metal may include at least one of titanium (Ti), zirconium (Zr), hafnium (Hf), tantalum (Ta), and niobium (Nb). Magnesium (Mg), which is a divalent metal, may also be included.

The piezoelectric layer 360 may include a piezoelectric portion 362 disposed in a flat portion S, and a bent portion 364 disposed in an extension portion E.

The piezoelectric portion 362 may be a portion directly stacked on the upper surface of the lower electrode 350. Therefore, the piezoelectric portion 362 may be disposed between the lower electrode 350 and the upper electrode 370, and may be formed in a flat shape, together with the lower electrode 350 and the upper electrode 370.

The bent portion 364 may be defined as a portion extending in an outward direction from the piezoelectric portion 362, and may be located in the extension portion E.

The bent portion 364 may be disposed on the insertion layer 180 to be described later, and may be formed in a shape raising along a shape of the insertion layer 380. The piezoelectric layer 360 may be bent at the boundary between the piezoelectric portion 362 and the bent portion 364, and the bent portion 364 may be raised corresponding to a thickness and a shape of the insertion layer 380.

The bent portion 364 may be divided into an inclined portion 364a and an extended portion 364b.

The inclined portion 364a refers to a portion formed to be inclined along an inclined surface L of the insertion layer 380 to be further described later. The extended portion 364b refers to a portion extending in an outward direction from the inclined portion 364a.

The inclined portion 364a may be formed parallel to the inclined surface L of the insertion layer 380, and an inclination angle of the inclined portion 364a may be formed to be equal to an inclination angle (θ in FIG. 8) of the inclined surface L of the insertion layer 380.

The upper electrode 370 may be formed to cover at least a portion of the piezoelectric layer 360 disposed in a position above the cavity C. The upper electrode 370 may be used as either an input electrode or an output electrode for inputting and outputting an electrical signal such as a radio frequency (RF) signal, and the like. For example, when the lower electrode 350 is used as an input electrode, the upper electrode 370 may be used as an output electrode, and when the lower electrode 350 is used as an output electrode, the upper electrode 370 may be used as an input electrode.

The upper electrode 370 may be formed using a conductive material such as molybdenum (Mo), or alloys thereof; however, the present disclosure is not limited thereto, and the upper electrode 370 may be formed of a conductive material such as ruthenium (Ru), tungsten (W), iridium (Ir), platinum (Pt), copper (Cu), titanium (Ti), tantalum (Ta), nickel (Ni), chromium (Cr), and the like, or alloys thereof.

The insertion layer 380 may be disposed between the lower electrode 350 and the piezoelectric layer 360. The insertion layer 380 may be formed of a dielectric, such as silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), but may be formed of a material different from those of the piezoelectric layer 360. In addition, a region in which the insertion layer 380 is provided may be formed as an air pocket if necessary. This may be accomplished by removing the insertion layer 380 during the manufacturing process.

In this example, the thickness of the insertion layer 380 may be the same as or similar to the thickness of the lower electrode 350. The insertion layer 380 may be formed to be thinner than the piezoelectric layer 360, or may be formed to similar to the piezoelectric layer 360. For example, the insertion layer 380 may be formed to have a thickness of 100 Å or more, and may be formed to be thinner than a thickness of the piezoelectric layer 360. The configuration of the present disclosure is not limited thereto.

The insertion layer 380 may be disposed along a surface formed by the membrane layer 340, the lower electrode 350, and the etching prevention portion 330.

The insertion layer 380 may be disposed around the flat portion S to support the bent portion 364 of the piezoelectric layer 360. Therefore, the bent portion 364 of the piezoelectric layer 360 may be divided into the inclined portion 364a and the extended portion 364b, depending on a shape of the insertion layer 380.

The insertion layer 380 may be disposed in a region other than the flat portion S. For example, the insertion layer 380 may be disposed over the entire region except the flat portion S, or may be disposed in a partial area.

At least a portion of the insertion layer 380 may be disposed between the piezoelectric layer 360 and the lower electrode 350.

A side surface of the insertion layer 380 disposed along the boundary of the flat portion S may be formed in a thicker form, as a distance from the flat portion S increases. The insertion layer 380 may be formed of an inclined surface L such that a side surface to be disposed adjacent to the flat portion S has a constant inclination angle θ.

To manufacture the insertion layer 380, when the inclination angle θ of the side surface of the insertion layer 380 is less than 5 degrees, the thickness of the insertion layer 380 may be made very thin or a region of the inclined surface L may be excessively large, which would make the insertion layer 380 difficult to manufacture.

In addition, when the inclination angle θ of the side surface of the insertion layer 380 is formed wider than 70 degrees, an inclination angle of the inclined portion 364a of the piezoelectric layer 360 stacked on the insertion layer 380 may be formed to be wider than 70 degrees. In this example, since the piezoelectric layer 360 may be excessively bent, a crack may occur in the bent portion of the piezoelectric layer 360.

Therefore, in this example, the inclination angle θ of the inclined surface L may be formed in a range of 5 degrees or more and 70 degrees or less, e.g., a range between 5-70 degrees.

The passivation layer 390 may be formed in a region except for a portion of the lower electrode 350 and the upper electrode 370. The passivation layer 390 may prevent damage to the upper electrode 370 and the lower electrode 350 during the manufacturing process.

Furthermore, the passivation layer 390 may be partially removed in a final process by etching depending on the desired frequency control. For example, the thickness of the passivation layer 390 may be adjusted. A dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide (HfO$_2$), aluminum oxide (Al$_2$O$_3$), titanium oxide (TiO$_2$), and zinc oxide (ZnO) may be used as an example of the passivation layer 390.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic wave filter device, comprising:
    resonance portions each comprising a lower electrode disposed on a substrate, a piezoelectric layer disposed on at least a portion of the lower electrode, and an upper electrode disposed on at least a portion of the piezoelectric layer;
    first metal pads connected to one of the upper electrode and the lower electrode of a corresponding resonance portion among the resonance portions; and
    second metal pads disposed outwardly of an active region and connected to the other one of the upper electrode and the lower electrode of adjacent resonant portions among the resonance portions,
    wherein a ring portion disposed outwardly of the active region in which the lower electrode, the piezoelectric layer, and the upper electrode overlap is disposed only on a portion of any one of the first and second metal pads, and
    wherein an interval between adjacent resonance portions connected to the first metal pad having the ring portion is greater than an interval between adjacent resonance portions connected to the first metal pad not having the ring portion.

2. The acoustic wave filter device according to claim 1, wherein the ring portion is disposed to surround a portion of the active region.

3. The acoustic wave filter device according to claim 1, wherein the first metal pads are connected to the lower electrode, the second metal pads are connected to the upper electrode, and
    the ring portion is only provided in a portion of the first metal pads.

4. The acoustic wave filter device according to claim 3, wherein the second metal pads connect the upper electrode of the adjacent resonance portions.

5. The acoustic wave filter device according to claim 4, wherein the second metal pad, disposed opposite to the first metal pad, and not having the ring portion gains an area which otherwise could have been occupied by the ring portion.

6. The acoustic wave filter device according to claim 1, wherein the upper electrode comprises a frame portion disposed at an edge of the active region, and
    the ring portion is disposed outside of the frame portion.

7. The acoustic wave filter device according to claim 1, wherein the first and second metal pads are formed of any one of gold (Au), a gold-tin (Au—Sn) alloy, copper (Cu), a copper-tin (Cu—Sn) alloy, aluminum (Al), and an aluminum alloy.

8. The acoustic wave filter device according to claim 1, wherein each of the resonance portions further comprises a cavity formed between a membrane layer and the substrate.

9. The acoustic wave filter device according to claim 8, wherein each of the resonance portions further comprises a passivation layer disposed in a region outside a region in which the first and second metal pads are formed.

10. The acoustic wave filter device according to claim 8, wherein each of the resonance portions further comprises an etching prevention portion disposed between the substrate and the lower electrode and disposed around the cavity.

11. An acoustic wave filter device, comprising:
    resonance portions each comprising a lower electrode disposed on a substrate, a piezoelectric layer disposed on at least a portion of the lower electrode, and an upper electrode disposed on at least a portion of the piezoelectric layer; and an insertion layer disposed in a position lower than a position of a portion of the piezoelectric layer;
    first metal pads connected to one of the upper electrode and the lower electrode of a corresponding resonance portion among the resonance portions; and
    second metal pads disposed outwardly of an active region and connected to the other one of the upper electrode and the lower electrode of adjacent resonant portions among the resonance portions,
    wherein a ring portion disposed outwardly of the active region in which the lower electrode, the piezoelectric layer, and the upper electrode overlap is disposed only on a portion of any one of the first and second metal pads.

12. An acoustic wave filter device, comprising:
    resonance portions each comprising a lower electrode disposed on a substrate, a piezoelectric layer disposed on at least a portion of the lower electrode, and an upper electrode disposed on at least a portion of the piezoelectric layer;
    first metal pads, wherein for each of the resonant portions, one of the upper electrode and the lower electrode is connected to a corresponding one of the first metal pads;
    second metal pads, wherein for each of the resonant portions, the other of the upper electrode and the lower electrode is connected to a corresponding one of the second metal pads,
    wherein a peripheral portion, disposed outwardly of an active region in which the lower electrode, the piezoelectric layer, and the upper electrode overlap, is disposed only on a portion of any one of the first and second metal pads, and
    wherein an interval between adjacent resonance portions connected to the first metal pad having the ring portion is greater than an interval between adjacent resonance portions connected to the first metal pad not having the ring portion.

13. The acoustic wave filter device according to claim 12, wherein the first and second metal pads are formed of any one of gold (Au), a gold-tin (Au—Sn) alloy, copper (Cu), a copper-tin (Cu—Sn) alloy, aluminum (Al), and an aluminum alloy.

14. The acoustic wave filter device according to claim 12, wherein the peripheral portion is disposed to surround a portion of the active region.

15. The acoustic wave filter device according to claim 12, wherein the first metal pads are connected to the lower electrode, the second metal pads are connected to the upper electrode, and the peripheral portion partially surrounds the first metal pads.

16. The acoustic wave filter device according to claim 15, wherein the second metal pads connect the upper electrode of the adjacent resonance portions.

17. The acoustic wave filter device according to claim 12, wherein each of the resonance portions further comprises a cavity formed between a membrane layer and the substrate.

18. The acoustic wave filter device according to claim 17, wherein each of the resonance portions further comprises a passivation layer disposed in a region outside a region in which the first and second metal pads are formed.

* * * * *